United States Patent [19]

Kato et al.

[11] Patent Number: 4,794,562

[45] Date of Patent: Dec. 27, 1988

[54] ELECTRICALLY-ERASABLE/PROGRAMMABLE NONVOLATILE SEMICONDUCTOR MEMORY DEVICE

[75] Inventors: Hideo Kato, Kawasaki; Hiroshi Iwahashi, Yokohama; Masamichi Asano, Tokyo; Akira Narita, Kawasaki; Shinichi Kikuchi, Yokohama, all of Japan

[73] Assignee: Kabushiki Kaisha Toshiba, Kawasaki, Japan

[21] Appl. No.: 94,458

[22] Filed: Sep. 9, 1987

[30] Foreign Application Priority Data

Sep. 29, 1986 [JP] Japan ................................ 61-230723

[51] Int. Cl.[4] .......................................... G11C 11/40
[52] U.S. Cl. .................................. 365/182; 357/23.6; 365/185
[58] Field of Search ...................... 365/182, 185, 189; 357/23.1, 23.5, 23.6

[56] References Cited

U.S. PATENT DOCUMENTS 4,278,989  7/1981  Baba et al. ............................ 357/59
4,709,255  11/1987  Hartgring et al. ................... 365/185

OTHER PUBLICATIONS

Lucero et al., "A 16 kbit Smart 5 V-Only EEPROM with Redundancy," IEEE Journal of Solid-State Circuits, vol. SC-18, No. 5, pp. 539-544, Oct. 1983.
Japanese Patent Disclosure (Kokai) No. 59-103366, H. Arakawa, Jun. 14, 1984.
Japanese Patent Disclosure (Kokai) No. 59-205763, N. Sumihiro, Nov. 21, 1984.

Primary Examiner—Terrell W. Fears
Attorney, Agent, or Firm—Finnegan, Henderson, Farabow, Garrett, & Dunner

[57] ABSTRACT

In an electrically-erasable/programmable nonvolatile semiconductor memory device according to the invention, a one-bit memory cell is constituted by a series circuit of a selecting MOS transistor and a data storage MOS transistor. A floating gate electrode and a control gate electrode are formed in the data storage MOS transistor, One portion of the floating gate electrode is formed on a channel region of the data storage MOS transistor through a gate insulating film. The other portion of the floating gate electrode is formed on a drain region of the data storage MOS transistor through a gate insulating film, a portion of which is sufficiently thinner than the gate insulating film. One and the other portions of the floating gate electrode are structurally separated from each other but are electrically connected with each other on a field region. A control gate electrode having substantially the same shape as that of the floating gate electrode is formed thereon through a gate insulating film.

11 Claims, 15 Drawing Sheets

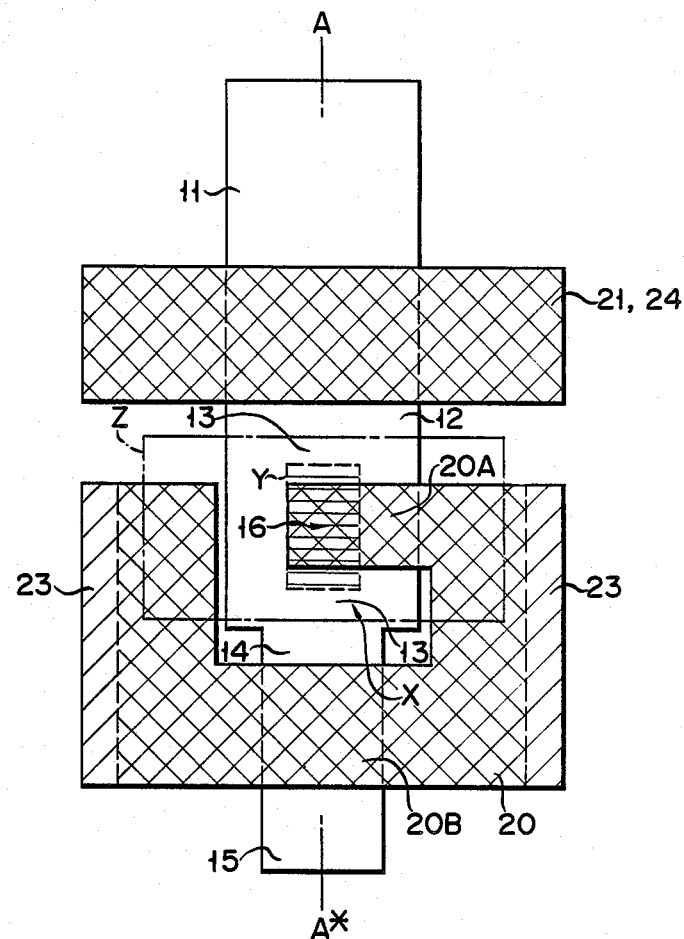
F I G. 5A
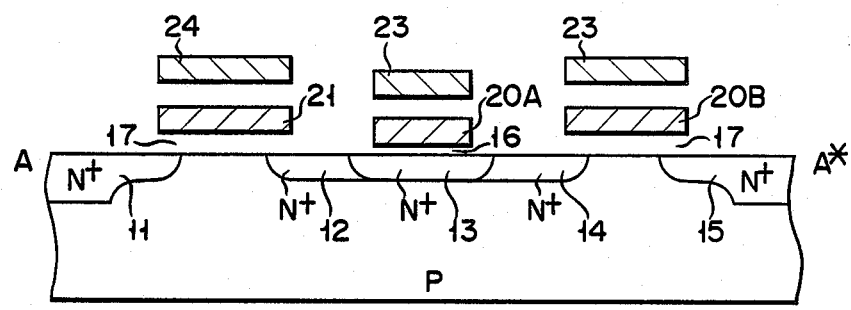
F I G. 5B

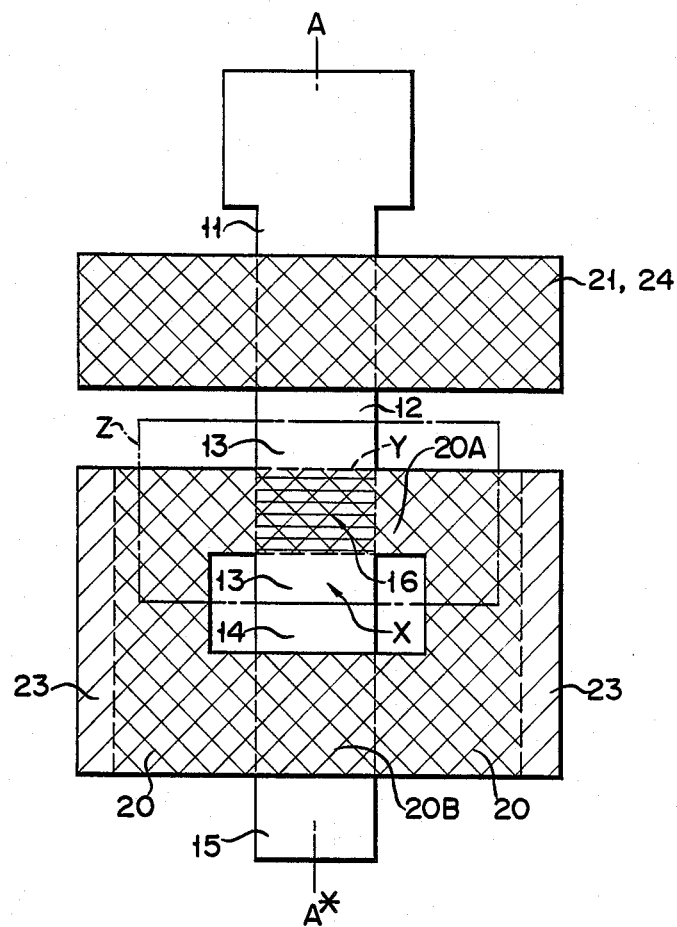
F I G. 6A
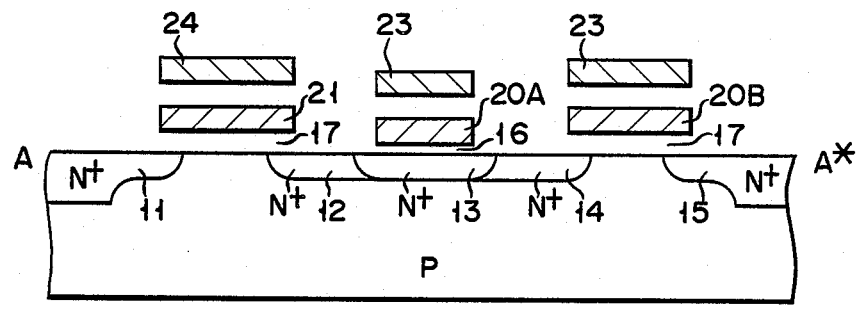
F I G. 6B

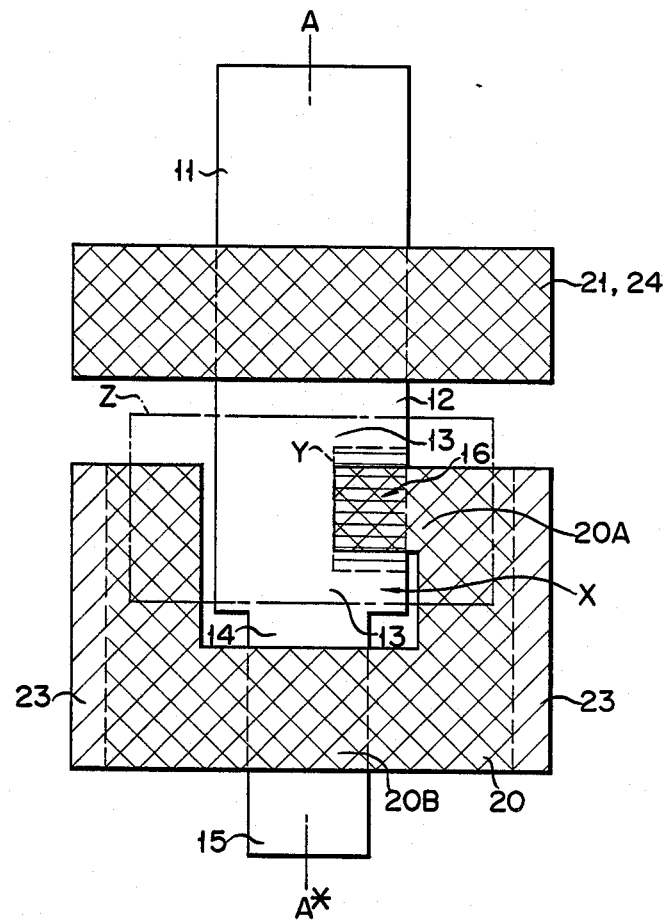
F I G. 7A
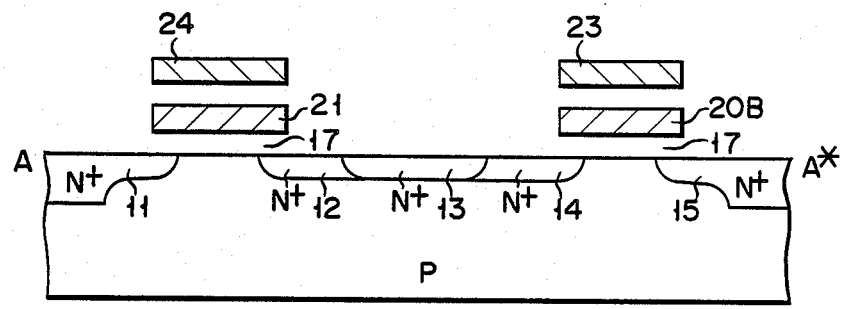
F I G. 7B

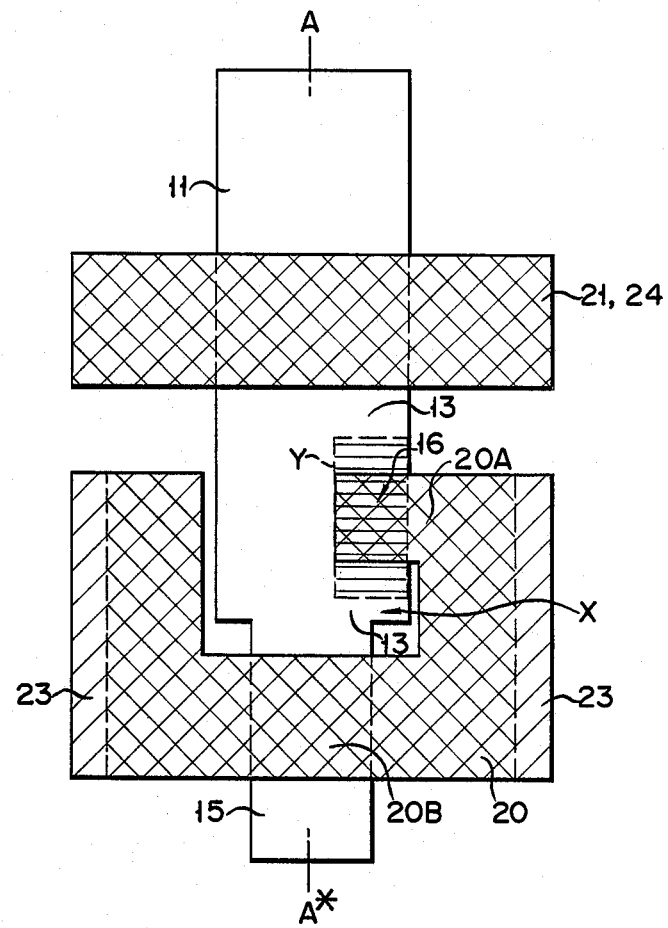
F I G. 8A
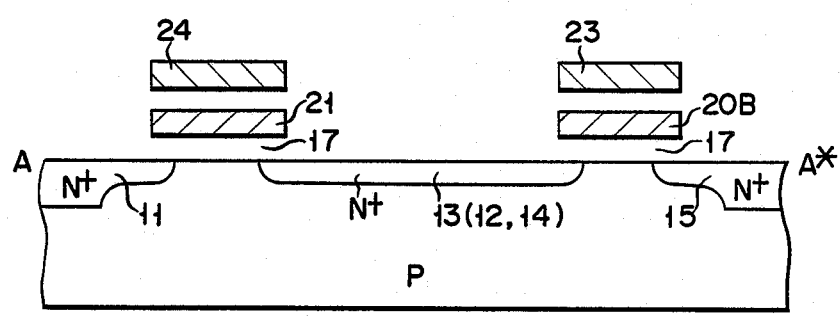
F I G. 8B

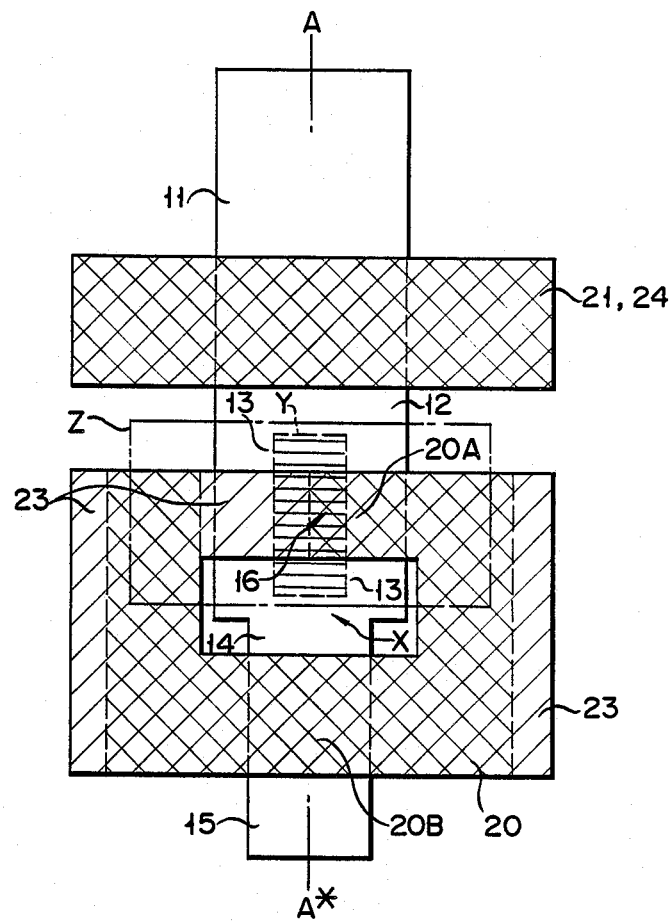
F I G. 10A
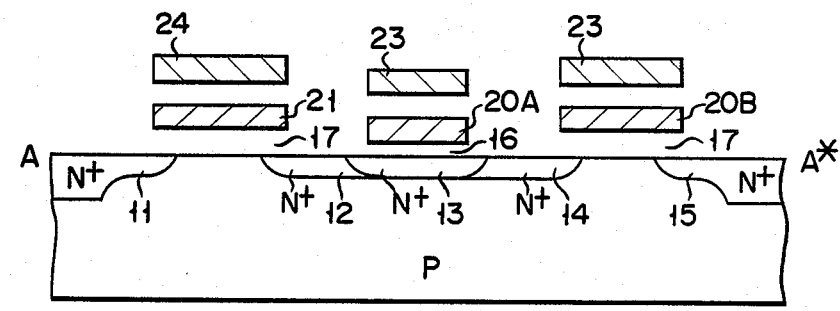
F I G. 10B

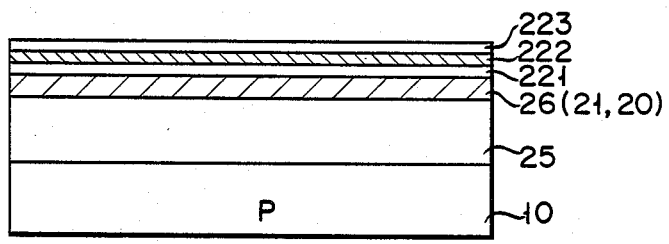
F I G. 13A
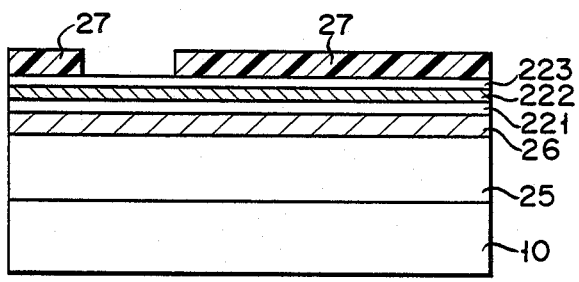
F I G. 13B
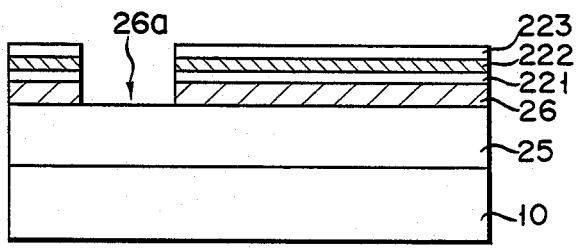
F I G. 13C
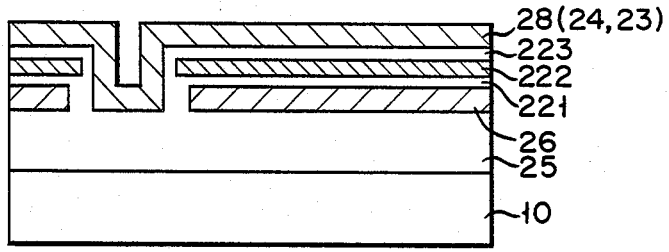
F I G. 13D

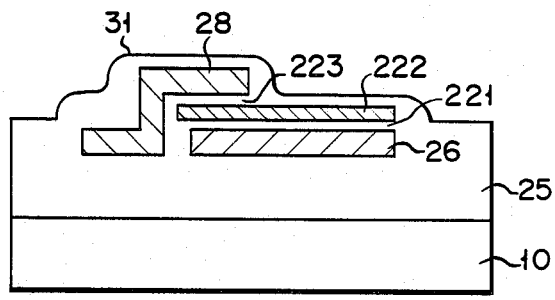
F I G. 13I
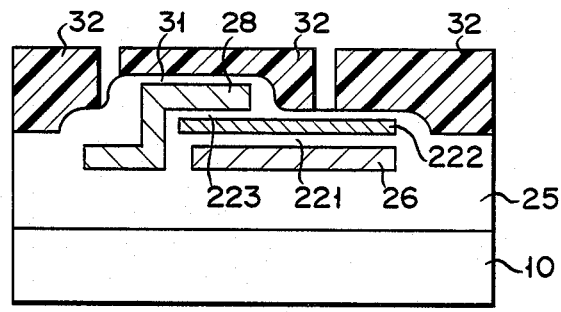
F I G. 13J
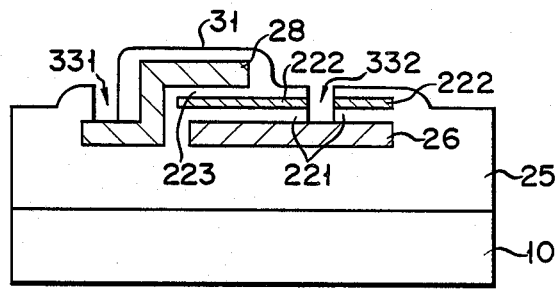
F I G. 13K
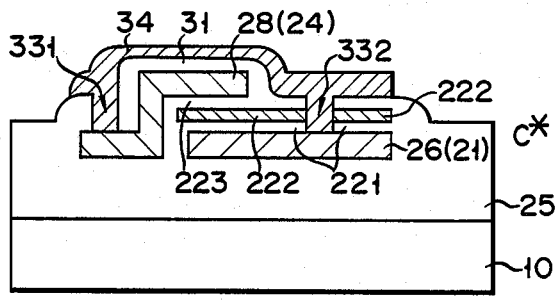
F I G. 13L

ELECTRICALLY-ERASABLE/PROGRAMMABLE NONVOLATILE SEMICONDUCTOR MEMORY DEVICE

BACKGROUND OF THE INVENTION

The present invention relates to an electrically-erasable/programmable nonvolatile semiconductor memory device (EEPROM) in which data can be electrically rewritten and programmed data can be semipermanently stored.

An EEPROM in which data can be electrically erased/programmed generally uses a MOS transistor having a double gate structure of floating and control gate electrodes as its memory cell.

FIG. 1 shows an equivalent circuit diagram of a one-bit memory cell of such an EEPROM. This memory cell is constituted by data storage MOS transistor CT and selecting MOS transistor SG which is connected in series with transistor CT. A drain region and part of floating gate electrode FG of transistor CT overlap each other through an ultr thin silicon oxide film having a thickness of about 100 Å.

In a memory cell having such an arrangement, data programming is performed by injecting electrons from the drain region to the floating gate electrode of transistor CT through the ultra thin silicon oxide film by the Fowler-Nordheim tunnel effect. On the contrary, data erasure in this memory cell is performed by emitting electrons from the floating gate electrode to the drain region through the ultra thin silicon oxide film.

That is, injection of electrons is performed by setting the control gate electrode of transistor CT at a high potential, increasing a floating gate electrode potential by capacitive coupling between the control and floating gate electrodes, and causing the electrons to move from the drain region to the floating gate electrode through the ultra thin silicon oxide film by the tunnel effect.

On the other hand, the emission of electrons is performed as follows. That is, a high potential is applied to the drain region of transistor SG and its gate electrode is set at a high potential, so that the drain region of transistor CT outputs a high potential. In this state, the control gate electrode of transistor CT is set at a circuit ground potential (0 V), and the electrons are caused to move from the floating gate electrode to the drain region through the ultra thin silicon oxide film by the tunnel effect. Thus, electrons are emitted from the floating gate electrode.

In the conventional memory cell described above, an electron injection time can be reduced as the potential of the floating gate electrode is increased during the injection of electrons. In addition, an electron emission time can be reduced as the potential of the floating gate electrode is decreased during the emission of electrons.

In order to sufficiently increase or decrease the potential of the floating gate electrode so as to reduce the electron injection/emission time, a coupling capacitance between the floating and control gate electrodes must be increased as much as possible. In order to satisfy this requirement, it is important to increase an overlapping area of the floating and control gate electrodes.

FIGS. 2A and 2B show an example of an arrangement of a memory cell in which an overlapping area of floating and control gate electrodes can be made large while an area of each memory cel itself in a semiconductor chip is small and hence memory cells can be highly integrated. FIG. 2A is a plan view showing a pattern of this memory cell arrangement, and FIG. 2B is a sectional view taken along the line B-B* of FIG. 2A. Known examples corresponding to FIGS. 2A and 2B are Japanese Patent Disclosure (Kokai) Nos. 59-103366 and 59-205763.

In this memory cell arrangement, a source region of selecting MOS transistor SG and a drain region of data soorage MOS transistor CT are respectively formed by $N^+$-type regions 120 and 130 continuously formed in P-type semiconductor substrate 100. Ultra thin silicon oxide film 160 having a thickness of about 100 Å is formed on part of region 130 to serve as a path of electrons. Polysilicon floating gate electrode 200 and polysilicon control gate electrode 230 are formed on channel region 190 and film 160 of transistor CT. Gate electrode 210 is formed on channel region 180 of transistor SG.

A drain region of transistor SG is represented by $N^+$-type region 110, and wiring for connecting a source region of transistor CT and source regions of transistors CT (not shown) in a plurality of other cells is represented by $N^+$-type region 150. In addition, silicon oxide films 170 sufficiently thicker (e.g., about 300- to 500-Å thick) than film 160 are formed below electrodes 210 and 230.

In order to manufacture the above memory cell, region 130 is formed beforehand by implanting an N-type impurity in substrate 100 using a mask having an opening at region Z represented by an alternate long and dashed line in FIG. 2A. Thereafter, 100-Å thick film 160 is formed on region 130, and film 170 having a thickness of several hundred Å is formed on the other regions to be used as a gate oxide film. Subsequently, a first polysilicon layer to serve as electrode 200 and a second polysilicon layer to serve as electrode 230 are formed on transistor CT. A polysilicon layer to serve as electrode 210 is formed on transistor SG in the same step as that of the formation of electrode 230.

After formation of the above electrodes, an N-type impurity is implanted in substrate 100 using electrodes 210 and 230 as masks. As a result, regions 110 and 120 of transistor SG and region 150 of transistor CT are formed in self-alignment with electrodes 210 and 230, respectively. At this time, region 120 is connected to preformed region 130.

According to the above-mentioned steps for manufacturing the memory cell shown in FIGS. 2A and 2B, electrode 200 is not self-aligned with preformed region 130. That is, misalignment of electrode 200 with region 130 is caused during mask alignment for forming electrode 200.

Variations occur in a degree of capacitive coupling (i.e., a coupling capacitance) between region 130 and electrode 200 of transistor CT due to this mask misalignment. For example, assuming that region 130 is deviated upward and electrode 200 is deviated downward in FIG. 2A, the coupling capacitance is decreased. On the contrary, when region 130 is deviated downward and electrode 200 is deviated upward, the coupling capacitance is increased.

A value of coupling capacitance between region 130 of transistor CT and electrode 200 is important when region 130 is set at a high potential and electrons are emitted from electrode 200. This is because the potential of electrode 200 obtained when region 130 is set at a high potential depends on the value of coupling capacitance. A magnitude of coupling capacitance corresponds to an amount of electrons emitted from electrode 200, and variations in the amount of emitted electrons correspond to variations in a gate threshold voltage of transistor CT after emission of electrons.

In addition, in the memory cell shown in FIGS. 2A and 2B, region 150 of transistor CT is formed using electrode 230 as a mask. For this reason, mask misalignment between electrode 200 and region 130 causes variations in a channel length of transistor CT. Such a mask misalignment occurs in the same direction in a single semiconductor wafer. However, if a wafer is different, a direction of mask misalignment is different. Thus, the electrical characteristics of memory cell become different in each wafer.

In addition, when the above memory cells are arranged in a matrix manner to obtain an IC, region 110 of transistor SG and region 150 of transistor CT are generally used in common by memory cells adjacent to each other vertically (or laterally) on a plane of the memory cell pattern. For this reason, when the mask misalignment occurs between electrode 200 and region 130 as described above, a difference in electrical characteristics occurs between two memory cells adjacent to each other vertically (or laterally) in FIG. 2A.

Therefore, the memory cell shown in FIGS. 2A and 2B is not suitable for realizing an IC with small variations in the electrical characteristics.

Furthermore, when the memory cell shown in FIGS. 2A and 2B is manufactured, after region 130 is formed by ion-implantation and the like, ions implanted in region 130 are diffused in various heat treatment steps. When such a diffusion occurs, an effective length of the channel is substantially decreased, thereby raising a problem of variations in the electrical characteristics of the memory cells.

When the memory cell having the structure as shown in FIGS. 2A and 2B is used, an area of the memory cell per bit can be decreased, so that an IC with high packing density can be realized. On the contrary, because of this structure, mask misalignment as described above tends to occur during manufacture of an IC, thereby causing large variations in the electrical characteristics between memory cells.

SUMMARY OF THE INVENTION

It is, therefore, an object of the present invention to provide an electrically-erasable/programmable nonvolatile semiconductor memory device in which the electrical characeristics of memory cells can be uniform while high packing density can be realized.

In an electrically-erasable/programmable nonvolatile semiconductor memory device according to the present invention, a one-bit memory cell is constituted by a series circuit of a selecting MOS transistor (SG) and a data storage MOS transistor (CT). A floating gate electrode (20) and a control gate electrode (23) are formed in the data storage MOS transistor (CT). One portion (20B) of the floating gate electrode (20) is formed on a channel region (19) of the data storage MOS transistor (CT) through a gate insulating film (17). The other portion (20A) of the floating gate electrode (20) is formed on a drain region (13) of the data storage MOS transistor (CT) through a gate insulating film (16) sufficiently thicker than the gate insulating film (17). One portion (20B) and the other portion (20A) of the floating gate electrode (20) are structurally separated from each other but are electrically connected with each other on a field region by a pattern of the floating gate electrode (20). In addition, a gate electrode (23) is formed on the floating gate electrode (20, 20A, and 20B) through a gate insulating film (22).

With the above arrangement, the ultra thin gate insulating film (16) through which electrons pass during data erasure/programming is located on an extended line (a horizontal direction of FIG. 2B) of the channel region (19) of the data storage MOS transistor (CT). In addition, the floating gate electrode (20) of the data storage MOS transistor (CT) is divided into two portions (20A and 20B) on its source region (15), drain regions (13 and 14), and gate region (19). Thus, a region (X) with no floating gate electrode is formed between one portion (20B) and the other portion (20A) of the floating gate electrode (20). This region (X) with no floating gate electrode absorbs an influence of the above-mentioned mask misalignment to prevent variations in the electrical characteristics of memory cells caused by this misalignment.

BRIEF DESCRIPTION OF THE DRAWINGS

FIG. 5A is a plan view of a modification of the embodiment in FIG. 3A in which a portion (20A) of the floating gate electrode (20) is cut away;

FIG. 5B is a sectional view taken along the line A-A* of FIG. 5A;

FIG. 6A is a plan view of a modification of the embodiment in FIG. 3A in which a width of a mask pattern (Y) which forms an ultra thin gate insulating film (16) is the same as that of the portion (20A) of the floating gate electrode (20) on the insulating film (16);

FIG. 6B is a sectional view taken along the line A-A* of FIG. 6A;

FIG. 7A is a plan view of a modification of the embodiment in FIG. 5A in which a position of the mask pattern (Y) which forms the ultra thin gate insulating film (16) is deviated to the right from a line (A-A*) connecting the centers of channel regions of selecting and memory MOS transistors (SG and CT);

FIG. 7B is a sectional view taken along the line A-A* of FIG. 7A;

FIG. 8A is a plan view of a modification of the embodiment in FIG. 7A in which source and drain regions (12 and 14) respectively of the selecting and memory MOS transistors (SG and CT) are formed in a single n+-type region (13);

FIG. 8B is a sectional view taken along the line A-A* of FIG. 8A;

FIG. 10A is a plan view of a modification of the embodiment in FIG. 9A in which an area half that of a portion of the ultra thin gate insulating film (16) below the mask pattern (Y) is covered with the control gate electrode (23);

FIG. 10B is a sectional view taken along the line A-A* of FIG. 10A;

FIGS. 13A to 13L are sectional views for explaining a process of manufacturing an IC structure shown in FIG. 12B.

DETAILED DESCRIPTION OF THE PREFERRED EMBODIMENTS

Embodiments of the present invention will be described below with reference to the accompanying drawings.

Figure 3A:
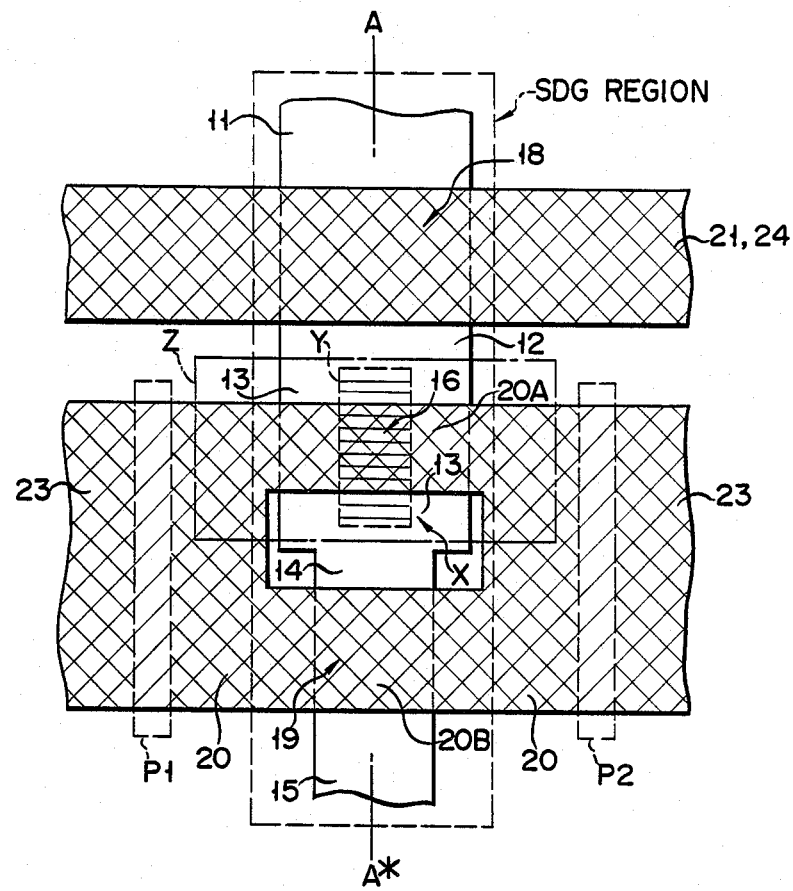
FIG. 3A is a plan view of a pattern structure of a memory cell of an EEPROM according to an embodiment of the present invention.
Figure 3B:
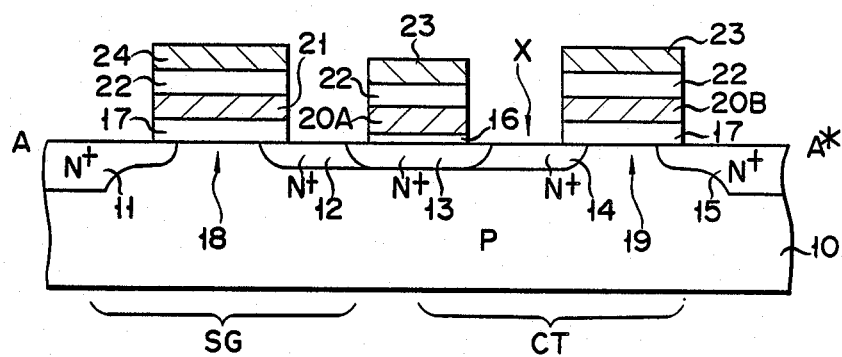
FIG. 3B is a sectional view taken along the line A-A* of FIG. 3A.

FIG. 3A is a plan view of a pattern structure of a memory cell of an EEPROM according to an embodiment of the present invention, and FIG. 3B is a sectional view taken along the line A-A* of FIG. 3A. In FIGS. 3A and 3B, N+-type regions 11 to 15 are formed in P-type silicon substrate 10. These regions 11 to 15 and channel regions 18 and 19, to be described later, are generally called SDG regions (source, drain, and gate regions), and a region other than the SDG regions is called a field region. Although not shown, an extremely thick silicon oxide film is formed on a surface portion of substrate 10 corresponding to the field region.

Figure 1:
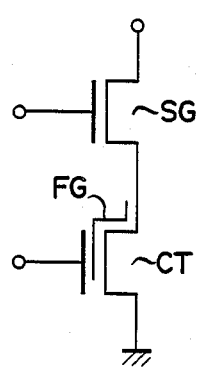
FIG. 1 is an equivalent circuit diagram of a one-bit memory cell of a general EEPROM.

Region 11 forms a drain region of selecting MOS transistor SG, and regions 12 to 14 form a source region of transistor SG and a drain region of data storage MOS transistor CT shown in FIG. 1. These regions 12 to 14 are continuously formed in series. Region 15 forms a source region of transistor CT.

Ultra thin silicon oxide film 16 having a thickness of about 100 Å through which electrons pass during data erasure/programming is formed on part of the surface of region 13. Relatively thick silicon oxide film 17 having a thickness of several hundreds Å is formed on the surface of region 13 except for the formation region of film 16.

Note that in this embodiment, glass mask pattern Y for forming film 16 is vertically elongated so as to extend from a floating gate electrode (20A) in the SDG region, as shown by a broken line in FIG. 3A.

Channel region 18 of transistor SG is formed on the surface portion of substrate 10 between regions 11 and 12, and channel region 19 of transistor CT is formed on the surface portion of substrate 10 between regions 14 and 15. Silicon oxide film 17 having a thickness of several hundred Å is also formed on regions 18 and 19 to serve as a gate insulating film.

Floating gate electrode 20 consisting of a first polysilicon layer is continuously formed on film 16 formed on region 13 and film 17 formed on region 19. Electrode 20 has a two-dimensional pattern in which a center (denoted by X in FIG. 3A) is partially removed. That is, in the SDG region, electrode 20 is separated into first portion 20A and second portion 20B. First and second portions 20A and 20B are connected by electrode 20 itself on the field region except for the SDG region.

In FIG. 3A, control gate electrode 23 consisting of a second polysilicon layer is continuously formed on electrode 20 (a plurality of electrodes exist in an actual IC) arranged in a transverse direction through silicon oxide film 22 having a thickness of several hundred Å. A width of a two-dimensional pattern of electrode 23 is set to be substantially the same as that of electrode 20 in a direction of the arrangement of a drain and a source in each memory cell (vertically in FIG. 3A). However, even if the width of electrode 23 is larger (or smaller) than that of electrode 20, the present invention can also be functional.

Gate electrode 21 consisting of the first polysilicon layer is formed on region 18 of transistor SG, and gate electrode 24 consisting of the second polysilicon layer is formed on electrode 21 through film 22. Upper and lower layer gate electrodes 24 and 21 of transistor SG are electrically connected with each other at a predetermined position (not shown), and electrode 21 serves as an actual gate electrode of transistor SG. Note that if electrodes 21 and 24 are electrically connected with each other at a plurality of positions at a predetermined interval, a gate wiring resistance of transistor SG can be decreased. An arrangement for this connection will be described later with reference to FIGS. 13A to 13L and FIG. 14.

By adopting an arrangmment in which the gate electrodes (21 and 24) having a two-layered structure of transistor SG are connected with each other, the gate electrode manufacturing steps of transistor SG can be the same as those of transistor CT. Therefore, the manufacturing steps for integrating the memory cell in FIGS. 3A and 3B can be simplified.

When the memory shown in FIGS. 3A and 3B is manufactured, an N-type impurity such as phosphorus is implanted first in substrate 10 using a mask having an opening at region Z represented by an alternate long and dashed line in FIG. 3A to form region 13. 100 Å thick film 16 is formed on part of region 13, and film 17 having a thickness of several hundred Å is formed on the other region. Thereafter, the first polysilicon layer is deposited on the entire surface of substrate 10.

In order to form the floating gate electrode (20) of each memory cell to be separated from the first polysilicon layer, portions of the first polysilicon layer surrounded by broken lines P1 and P2 in FIG. 3A are selectively removed first. Film 22 having a thickness of several hundred Å is formed on the remaining polysilicon layer. After the second polysilicon layer is deposited on film 22, layers 23 and 24, underlying film 22, and layers 20 and 21 under film 22 are sequentially and selectively etched using a predetermined mask. Thus, electrodes 20, 23, 21, and 24 are respectively formed by self-alignment.

Thereafter, when an N-type impurity is implanted in substrate 10 using electrodes 23 and 24 as masks, regions 11, 12, 14, and 15 are formed by self-alignment. At this time, regions 12 and 14 are electrically connected to preformed region 33.

Figure 2A:
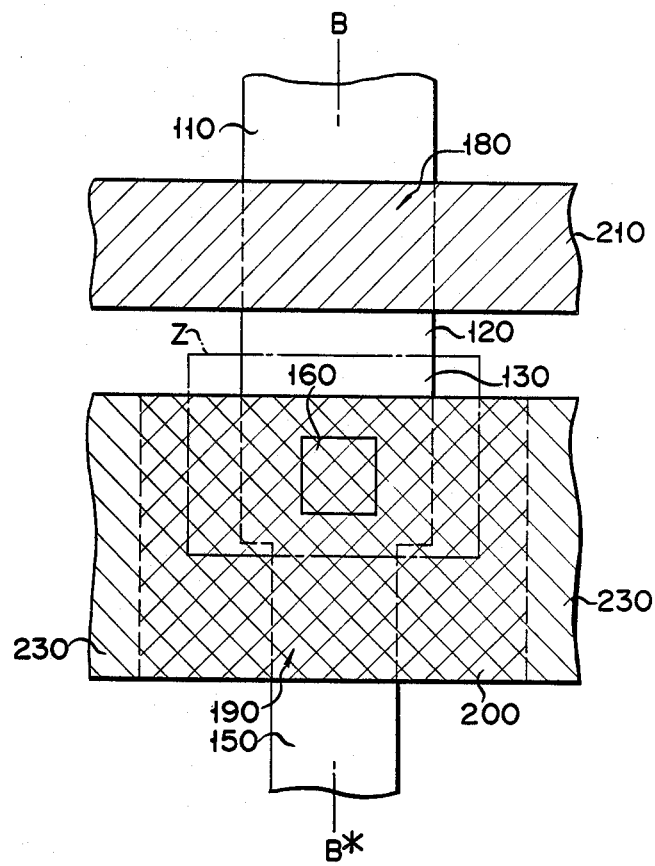
FIG. 2A is a plan view of a pattern structure of a memory cell of a conventional EEPROM.
Figure 2B:
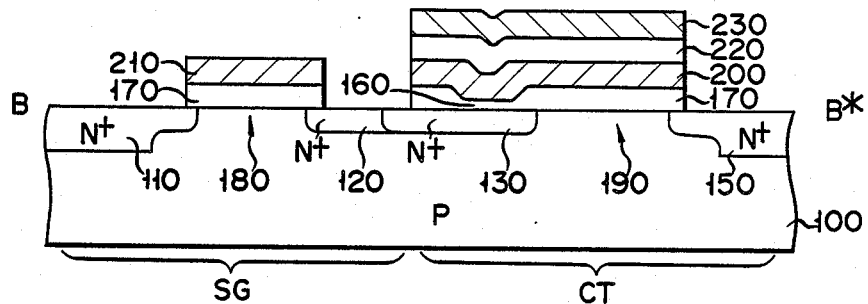
FIG. 2B is a sectional view taken along the line B-B* of FIG. 2A.

As described above with reference to FIGS. 2A and 2B, since electrode 20 (200) cannot be formed in self-alignment with region 13 (130), mask misalignment may occur therebetween.

However, according to the embodiment shown in FIGS. 3A and 3B, if the mask misalignment occurs, a coupling capacitance between drain regions (regions 12 to 14) and electrode 20 of transistor CT does not vary. The reason for this will be described below.

For example, if region 13 is deviated upward and first portion 20A of electrode 20 is deviated downward in FIG. 3A, or if region 13 is deviated to the left and first portion 20A of electrode 20 is deviated to the right in FIG. 3B, an area of a portion where region 13 and first portion 20A of electrode 20 overlap each other remains the same. Therefore, if the mask misalignment occurs, the coupling capacitance between the drain regions (regions 12 to 14) and electrode 20 (20A) of transistor CT does not vary.

On the contrary, if region 13 is deviated downward and first portion 20A of electrode 20 is deviated upward in FIG. 3A, or region 13 is deviated to the right and first portion 20A of electrode 20 is deviated to the left in FIG. 3B, the area of the portion where region 13 and first portion 20A of electrode 20 overlap each other still remains the same. Therefore, if the mask misalignment occurs, the coupling capacitance between the drain regions (regions 12 to 14) and electrode 20 (20A) of transistor CT does not vary.

That is, variations in an opposing area between electrode 20A and region 13 caused by the mask misalignment can be absorbed in a portion (X) where electrode 20 does not exist between first and second portions 20A and 20B of electrode 20. For this reason, if the mask misalignment occurs, no variations occur between coupling capacitances of the respective memory cells.

As a result, an amount of electrons emitted from electrode 20 can be constant with respect to every memory cell, so that variations in a gate threshold voltage in each memory cell after the emission of electrons can be prevented.

In addition, since regions 14 and 15 of transistor CT can be formed using electrodes 20 and 23, variations in a channel length of region 19 of transistor CT can be prevented.

As described above, the electrical characteristics can be uniform for every semiconductor wafer and every memory cell.

Furthermore, when the memory shown in FIGS. 3A and 3B is manufactured, even if the N+-type implanted ions are diffused in various heat treatment steps from region 13 preformed by ion-implatation or the like, the diffused ions do not reach region 19 of transistor CT to reduce its channel length. This is because region 14 interposed between regions 19 and 13 serves as a barrier to the diffused ions. For this reason, no attention need be paid to extension of region 13 caused by thermal diffusion.

Note that in FIG. 3B, region 11 of transistor ST is made shallower near region 18 so as to increase an extension of a depletion layer of the drain caused upon application of a high voltage to region 11, so that an electric field between drain 11 and gate 21 of transistor SG is weakened, thereby increasing a breakdown voltage therebetween. In this case, upon formation of region 11, a region of drain 11, in which an N+-type impurity is implanted, is controlled using a glass mask or the like, as needed.

Figure 4A:
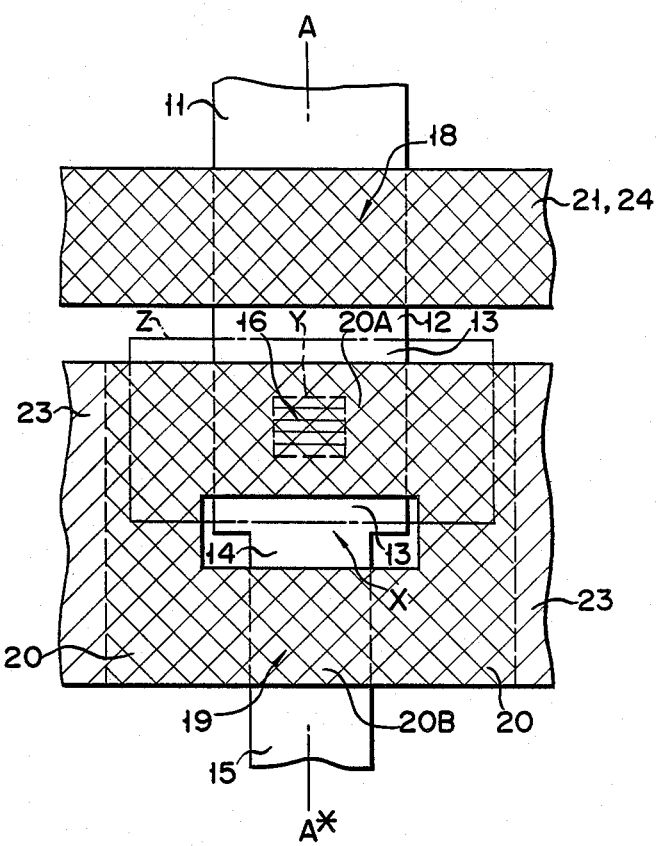
FIG. 4A is a plan view of a pattern structure of a memory cell of an EEPROM according to another embodiment of the present invention.
Figure 4B:
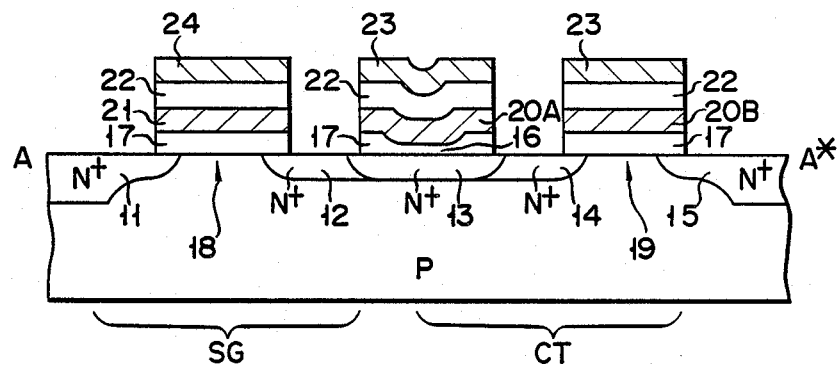
FIG. 4B is a sectional view taken along the line A-A* of FIG. 4A.

FIG. 4A shows a pattern structure of a memory cell of an EEPROM according to another embodiment of the present invention, and FIG. 4B is a sectional view taken along the line A-A* of FIG. 4A. The same elements as in FIGS. 3A and 3B are denoted by the same reference numerals in FIGS. 4A and 4B, and a detailed description thereof will be omitted.

An embodiment shown in FIGS. 4A and 4B differs from that shown in FIGS. 3A and 3B in that silicon oxide film 16 does not extend from first portion 20A of floating gate electrode 20 in the SDG region.

In the embodiment of FIGS. 3A and 3B, film 16 extends from first portion 20A of electrode 20. For this reason, when first polysilicon layer (20 and 21) and second polysilicon layer (23 and 24) are selectively etched by a self-alignment process, a portion of film 16 extending from first portion 20A of electrode 20 is simultaneously etched. In this case, a portion of the surface of substrate 10 located at the simultaneously etched portion is scraped, so that a notch tends to be formed between the scraped portion and its peripheral portion. Since the notch is so formed as to scrape out portions of N+-type layers 12 and 14, electrical resistances of layers 12 and 14 are increased or, in certain cases, layers 12 and 14 are broken off by this notch.

On the other hand, in the embodiment of FIGS. 4A and 4B, film 16 is formed inside electrode 20 and surrounded by thick silicon oxide film 17, thereby preventing formation of a notch caused by etching, as described above.

Note that in the embodiment shown in FIGS. 3A and 4A, right and left sides of first portion 20A and those of second portion 20B of electrode 20 are connected with each other in the field regions at right and left sides of the SDG region through electrode 20. However, the right (or left) side of first portion 20A and the right (or left) side of second portion 20B of electrode 20 can be connected with each other through one portion of electrode 20, as shown in FIG. 5A, or first portion 20A and second portion 20B of electrode 20 can be connected at a position remotely separated from the SDG region. In addition, an impurity concentration of region 13 need not be the same as those of regions 11, 12, 14, and 15.

Some modifications of the embodiments shown in FIGS. 3A and 4A will be briefly described below. In these modifications, some elements are not shown in the drawings. In addition, the same reference numerals denote the functionally identical elements throughout the views.

FIG. 5A is a plan view of a modification of the embodiment shown in FIG. 3A, and FIG. 5B is a sectional view taken along the line A-A* of FIG. 5A. In FIG. 5A, a portion (20A) at the left side of a floating gate electrode (20) is cut away.

FIG. 6A is a plan view of a modification of the embodiment shown in FIG. 3A, and FIG. 6B is a sectional view taken along the line A-A* of FIG. 6A. In FIG. 6A, a width of mask pattern Y which forms ultra thin gate insulating film 16 through which electrons pass during data erasure/programming is the same as that of portion 20A of floating gate electrode 20 on film 16.

FIG. 7A is a plan view of a modification of the embodiment shown in FIG. 5A, and FIG. 7B is a sectional view taken along the line A-A* of FIG. 7A. In FIG. 7A, a position of mask pattern Y which forms ultra thin gate insulating film 16 is deviated to the right in the drawing from a line (A-A*) connecting the centers of channel regions respectively of selecting MOS transistor SG and memory MOS transistor CT. For this reason, electrodes 20A and 23 are not shown in FIG. 7B, although they are actually present.

FIG. 8A is a plan view of a modification of the embodiment shown in FIG. 7A, and FIG. 8B is a sectional view taken along the line A-A* of FIG. 8A. In FIG. 8A, mask Z for preforming N+-type regions 13 in source region 12 of selecting MOS transistor SG and in drain region 14 of data storage MOS transistor CT is not used, but the entire source and drain regions (12 and 14) serve as single N+-type region 13.

Figure 9A:
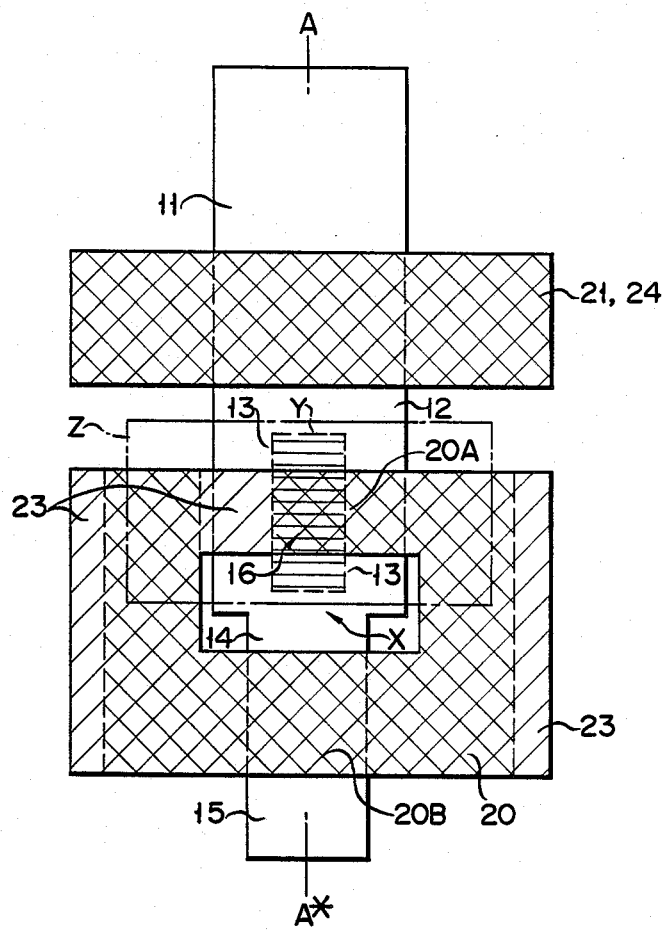
FIG. 9A is a plan view of a modification of the embodiment in FIG. 5A in which the portion cut away from the floating gate electrode (20) in the embodiment of FIG. 5A is covered with a control gate electrode (23)
Figure 9B:
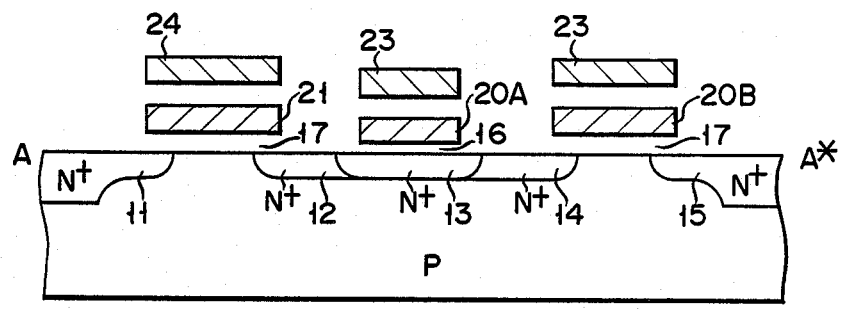
FIG. 9B is a sectional view taken along the line A-A* of FIG. 9A.

FIG. 9A is a plan view of a modification of the embodiment shown in FIG. 5A, and FIG. 9B is a sectional view taken along the line A-A* of FIG. 9A. In FIG. 9A, a portion of floating gate electrode 20 cut away in the embodiment of FIG. 5A is covered with control gate electrode 23.

FIG. 10A is a plan view of a modification of the embodiment shown in FIG. 9A, and FIG. 10B is a sectional view taken along the line A-A* of FIG. 10A. In FIG. 10A, the left half of an area of a portion which forms ultra thin gate insulating film 16 below mask pattern Y is covered with control gate electrode 23.

Figure 11A:
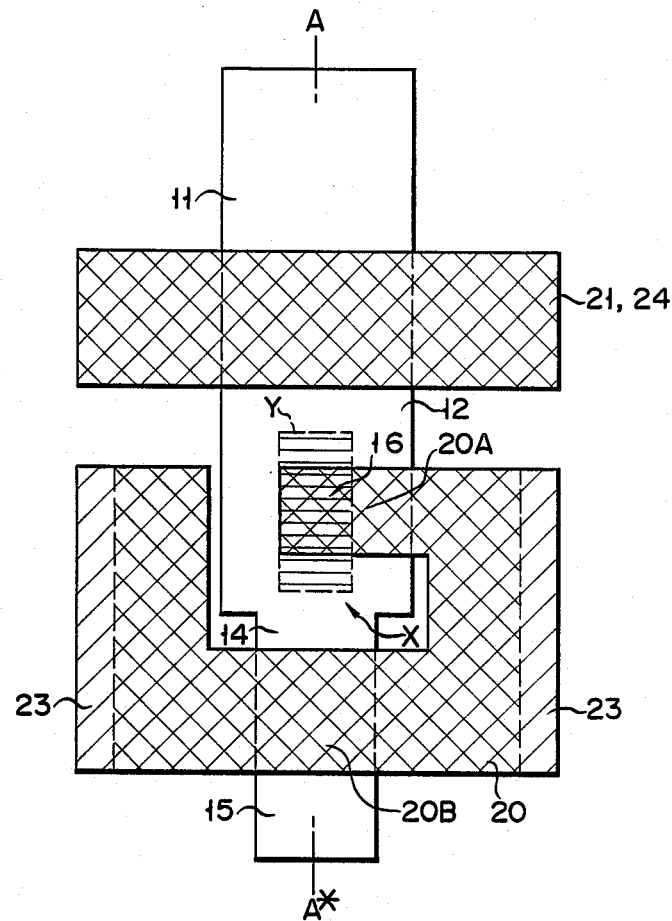
FIG. 11A is a plan view of a modification of the embodiment in FIG. 5A in which the N+-type region (13) is not preformed and the source and drain regions (12 and 14) respectively of the selecting and memory MOS transistors (SG and CT) are formed to be separated from each other, provided that the separately-formed N+-type region is connected to the N+-type layer at a region (the left side of region Y in FIG. 11A) other than that containing the floating gate electrode (20)
Figure 11B:
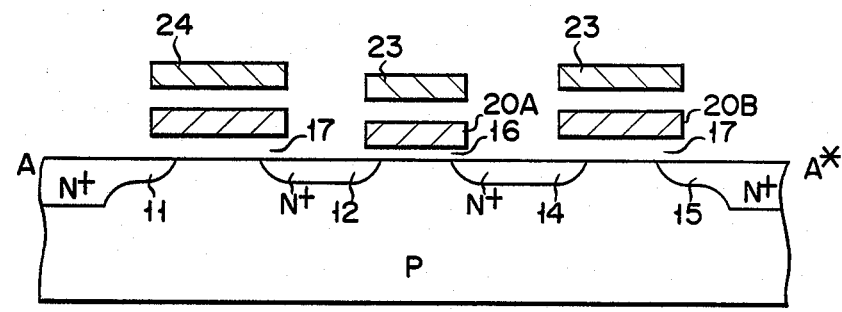
FIG. 11B is a sectional view taken along the line A-A* of FIG. 11A.

FIG. 11A is a plan view of a modification of the embodiment shown in FIG. 5A, and FIG. 11B is a sectional view taken along the line A-A* of FIG. 11A. In FIG. 11A, n+-type region 13 is not preformed, but source region 12 of selecting MOS transistor SG and drain region 14 of data storage MOS transistor CT are formed to be separated from each other.

Figure 12A:
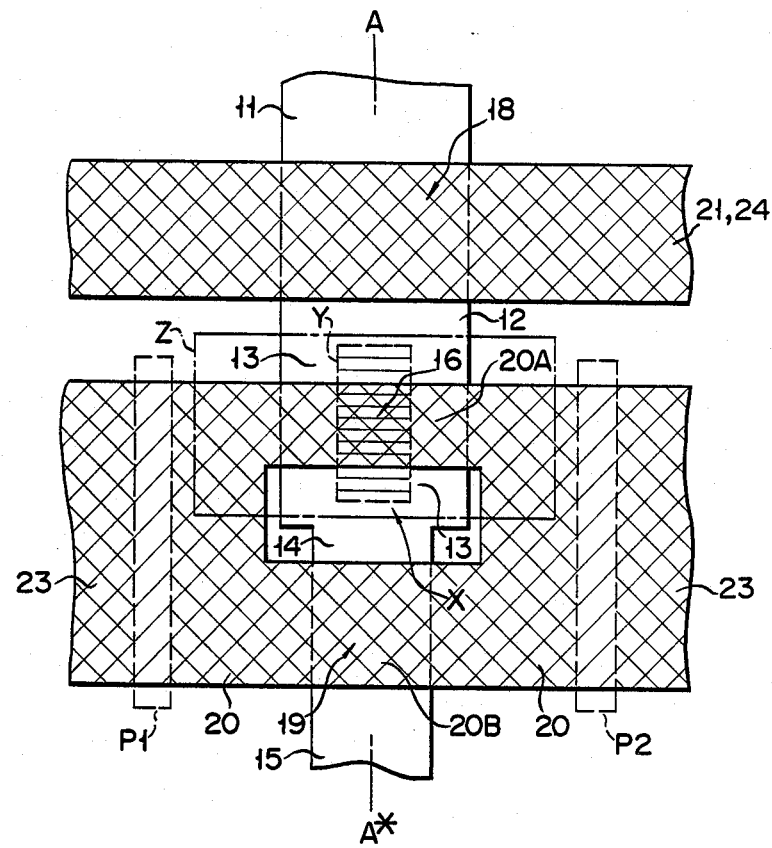
FIG. 12A is a plan view of a pattern structure of a memory cell of an EEPROM according to still another embodiment of the present invention.
Figure 12B:
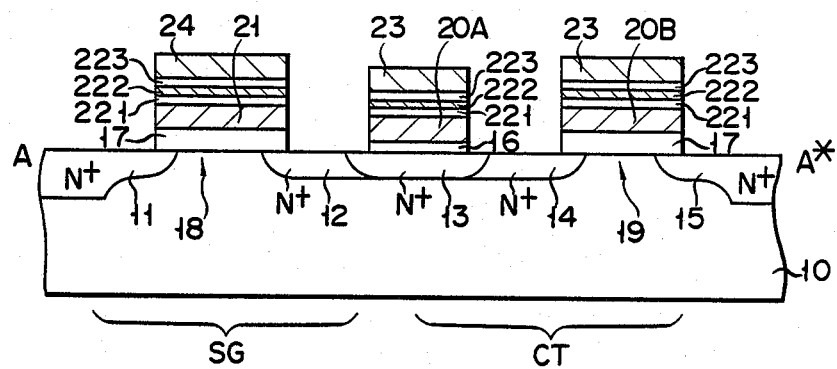
FIG. 12B is a sectional view taken along the line A-A* of FIG. 12A.

FIG. 12A is a plan view showing a pattern structure of a memory cell of an EEPROM according to still another embodiment of the present invention, and FIG. 12B is a sectional view taken along the line A-A* of FIG. 12A.

In an arrangement shown in FIGS. 12A and 12B, second selecting gate electrode 24 is electrically connected to first selecting gate electrode 21 at a plurality of positions (e.g., on a word line) in an IC pellet including a large number of memory cells. By this arrangement, electrode 21 is prevented from being floated in insulating layers 17 and 221, and an effective electrical resistance of electrode 21 is decreased by parallel connection of electrode 24.

Control gate electrode 23 is formed on floating gate electrodes 20A and 20B of data storage MOS transistor CT through an insulating layer of a three-layered structure obtained by sandwiching silicon nitride layer 222 between silicon oxide layers 221 and 223. Since the insulating layer of a three-layered structure, obtained by sandwiching layer 222 of silicon nitride having a dielectric constant higher than that of silicon oxide ($SiO_2$) between layers 221 and 223, is formed between floating gate electrode 20 (20A and 20B) and electrode 23, a coupling capacitance between these electrodes is increased to a higher capacitance than that obtained by using insulating layer 22 of a one-layered structure shown in FIG. 3B.

When such a three-layered structure is used, a coupling capacitance between electrodes 20 (20A and 20B) and 23 can be increased even if a pattern area of electrode 23 is small. When a potential applied to electrode 23 is constant, an amount of electrons injected in electrode 20 is increased as the coupling capacitance between electrodes 20 and 23 is increased, and a data programming speed to a memory cell is increased.

In addition, since the dielectric constant of layer 222 is high, a thickness of insulating layers (221 to 223) between electrodes 20 (20A and 20B) and 23 need not be decreased to obtain a large coupling capacitance thereby sufficiently increasing a withstanding voltage between electrodes 20 (20A and 20B) and 23. This high withstanding voltage reduces leakage of a stored charge from electrode 20.

FIGS. 13A to 13L are sectional views for explaining a process of manufacturing an IC structure shown in FIG. 12B.

In FIG. 13A, field oxide film 25 for element isolation is formed on P-type substrate 10. An N+-type impurity (e.g., phosphorus) is ion-implanted in an element region isolated by film 25 to form N+-type diffusion layer 13 shown in FIG. 12B (not shown in Fi. 13A).

Gate insulating film 17 is formed on substrate 10 of the element region. Subsequently, a portion of film 17 where ultra thin gate insulating film 16 shown in FIG. 12B is to be formed is selectively etched, and substrate 10 is thermally oxidized to form film 16 having a thickness of about 100 Å at the selectively etched portion (not shown in FIG. 13A).

First polysilicon layer 26 is deposited on film 25 and on gate insulating films 16 and 17 (layer 26 is used to form electrodes 20 and 21). Subsequently, layer 26 is thermally oxidized to form silicon oxide film 221 on its surface. Layer 222 of silicon nitride ($Si_3N_4$) is deposited on film 221. Thereafter, silicon oxide film 223 is formed on layer 222 to complete a three-layered structure of oxide/nitride/oxide films, i.e., an O/N/O structure.

In FIG. 13B, photoresist 27 is coated on the entire surface of film 223 to perform patterning.

Then, in FIG. 13C, film 223, layer 222, film 221, and layer 26 are etched using photoresist 27 as a mask, thereby forming opening 26a. At this time, portions P1 and P2 shown by broken lines in FIG. 12A are removed by etching. In addition, layer 26 located on a peripheral circuit of a memory cell portion (not shown) is patterned by photoresist 27.

Figure 13E:
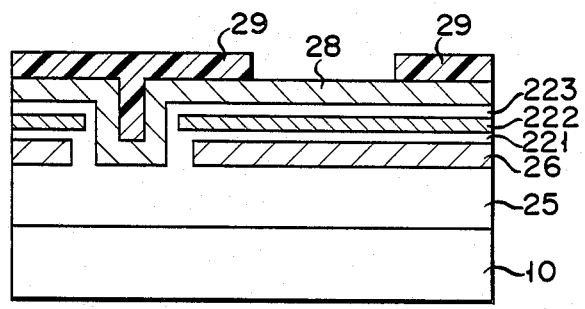

In FIG. 13D, second polysilicon layer 28 is deposited on film 223 (layer 28 is used to form electrodes 23 and 24). At this time, since layer 28 is also formed on the peripheral circuit (not shown), layer 28 at the peripheral circuit except for the memory cell portion is removed by etching in the next step. Further, as is shown in FIG. 13E, patterning is performed by photoresist 29 to obtain a contact between first and second layers 26 and 28. Second layer 28 is etched using photoresist 29 as a mask.

Figure 13F:
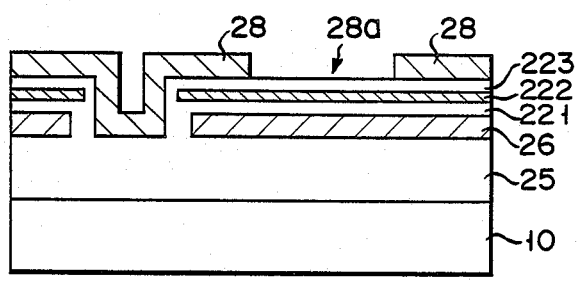

Therefore, a portion without layer 28, i.e., opening 28a of FIG. 13F is formed in a memory cell array including a large number of memory cells shown in FIG. 12A.

Figure 13G:
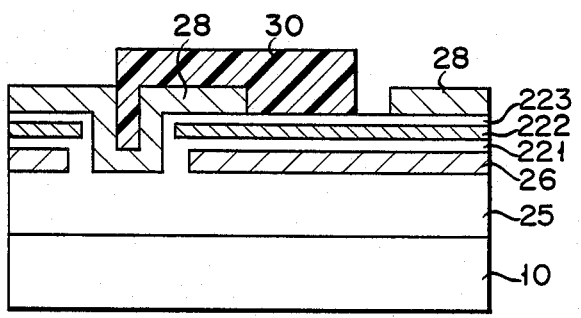

Then, in FIG. 13G, in order to form selecting MOS transistor SG and data storage MOS transistor CT, patterning is performed again on the entire surface of layer 28 by coating photoresist 30 thereon.

Figure 13H:
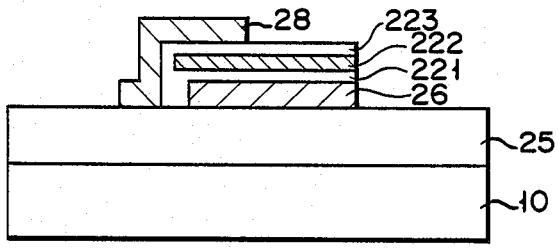

As shown in FIG. 13H, layer 28, film 223, layer 222, film 221, and layer 26 are selectively etched using photoresist 30 of FIG. 13G as a mask. At this time, control and floating gate electrodes 23 and 20 of transistor CT and first and second control gate electrodes 21 and 24 of transistor SG shown in FIG. 12A and 12B are formed by self-alignment by the same photoresist pattern 30.

In FIG. 13I, silicon oxide film 31 is formed on the entire surface of an IC pattern after formation by self-alignment.

In FIG. 13J, patterning is performed on film 31 by coating photoresist 32 thereon.

After this patterning, as shown in FIG. 13K, contact holes 331 and 332 are formed using photoresist pattern 32 of FIG. 13J as a mask.

Thereafter, as shown in FIG. 13L, aluminum layer 34 is deposited on the entire surface of the IC pattern. Electrodes 21 and 24 (layers 26 and 28) of transistor SG are electrically connected with each other through aluminum wiring 34 obtained by patterning layer 34.

Thereafter, an N+-type impurity is ion-implanted using electrodes 23 and 24 of FIG. 12B as masks to form N+-type diffusion regions 11, 12, 14, and 15 by self-alignment.

Figure 14:
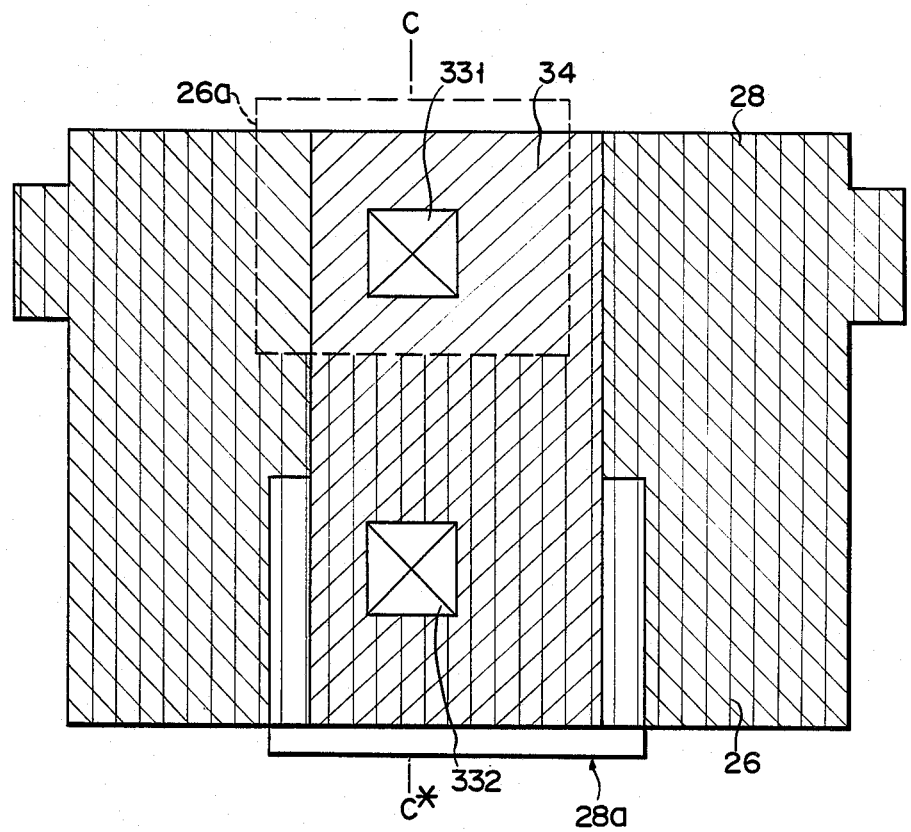
FIG. 14 is a plan view of the IC structure of FIG. 13L, wherein a sectional view taken along the line C-C* of FIG. 14 corresponds to FIG. 13L.

Note that the two-dimensional pattern of the IC structure of FIG. 13L is as shown in FIG. 14. In FIG. 14, a cross section taken along the line C–C* thereof corresponds to FIG. 13L.

According to the IC manufacturing method as described above, electrodes 23 and 20 of transistor CT can be formed by self-alignment. In addition, mask misalignment does not occur because of this self-alignment formation, and an area of electrode 23 on electrode 20 need not be larger than that of electrode 20. Therefore, a pattern area of electrode 23 can be decreased to increase packing density of the IC.

Furthermore, when electrodes 21 and 24 of transistor SG are connected in parallel with each other at a plurality of positions by connecting means (26, 34, 331, and 332) as shown in FIG. 14, an electrical resistance of the wiring (word line) of electrodes 21 and 24 can be decreased to about half that obtained when electrodes 21 and 24 are not connected in parallel with each other. For this reason, the response speed of the word line becomes high, so that an access speed of the memory according oo the present invention is higher than that of a conventional one.

Note that in FIG. 13L, a contact hole for connecting two layers 26 and 28 (or 21 and 24) is formed at a portion where only one polysilicon layer exists. This is because the yield can be improved during exposure of a photoresist when a contact hole is formed at a portion with less notches, i.e., at a portion with one polysilicon layer.

In addition, the step of patterning opening 26a and the step of patterning a peripheral circuit shown in FIG. 13C need not be performed at the same time. For example, the first polysilicon layer of the peripheral circuit may be patterned after the second polysilicon layer (28) thereof is removed. In this case, the first polysilicon layer (26) is deposited, patterned, and then oxidized, so that a $Si_3N_4$ layer can be formed on this oxide layer. The second polysilicon layer (28) may be etched after a memory cell transistor is formed by self-alignment.

Furthermore, layers 11, 12, 14, and 15 need not be formed by self-alignment using electrodes 23 and 24 as masks, but can be formed as follows. That is, an N-type layer is first formed by self-alignment using electrodes 23 and 24 as masks, and then is covered with a photoresist again to be patterned. Subsequently, an N+-type layer may be formed at a portion separated from electrodes 23 and 24 by ion implantation.

With the above arrangement, a breakdown voltage of the control gate electrode of transistor SG is increased, so that a higher voltage can be applied to the control gate electrode of transistor CT. For this reason, an electron injection/emission efficiency (programming efficiency) with respect to the floating gate electrode is improved.

As has been described above, according to the present invention, there is provided an electrically-erasable/programmable nonvolatile semiconductor memory device in which a memory cell can be integrated with high packing density, and at the same time, the electrical characteristics of the memory cell can be uniform.

Note that a structure disclosed in U.S. Pat. No. 4,278,989 issued on July 14, 1981 can be applied to the node between electrodes 21 and 24 shown in FIG. 3B. All disclosures in this U.S. patent are incorporated in the present application.

What is claimed is:

1. An electrically erasable/programmable nonvolatile semiconductor memory device, comprising:
   a memory cell constituted by a series circuit of a selecting MOS transistor and a data storage MOS transistor, a floating gate electrode and a control gate electrode being formed in said data storage MOS transistor, wherein:
   one portion of said floating gate electrode is formed on a channel region of said data storage MOS transistor through a first gate insulating film; and
   the other portion of said floating gate electrode is formed on a drain region of said data storage MOS transistor through a second gate insulating film thinner than said first gate insulating film,
   wherein said one portion and said other portion of said floating gate electrode are structurally separated from each other but electrically connected with each other.

2. A semiconductor memory device according to claim 1, wherein:
   the drain region of said data storage MOS transistor includes a first drain region formed immediately below said second gate insulating film, and a second drain region, interposed between said first drain region and said channel region to be in contact with said first drain region, and having the same conductivity type as that of said first drain region.

3. A semiconductor memory device according to claim 1, wherein:
   a mask pattern for forming said second gate insulating film has a configuration extending from a pattern of said floating gate electrode.

4. A semiconductor memory device according to claim 1, wherein:
   a mask pattern for forming said second gate insulating film has a configuration not extending from a pattern of said floating gate electrode.

5. A semiconductor memory device according to claim 1, wherein:
   a size of a pattern of said control gate electrode is substantially the same as that of said floating gate electrode with respect to a drain-to-source direction of said data storage MOS transistor.

6. A semiconductor memory device according to claim 1, wherein:

said control gate electrode having substantially the same shape as that of said floating gate electrode is formed on said floating gate electrode through a third gate insulating film.

7. A semiconductor memory device according to claim 1, wherein:
said control gate electrode is formed on said floating gate electrode through said third gate insulating film, and
said third gate insulating film has a three-layered structure obtained by sandwiching a high dielectric constant layer between silicon oxide layers.

8. A semiconductor memory device according to claim 1, wherein:
a first selecting gate electrode is formed on a channel region of said selecting MOS transistor through a first selecting gate insulating film,
a second selecting gate electrode is formed on said first selecting gate electrode through a second selecting gate insulating film, and
said second selecting gate electrode is electrically connected to said first selecting gate electrode at a plurality of portions, so that an electrical resistance of said first selecting gate electrode is decreased by a parallel connection of said second selecting gate electrode.

9. A semiconductor memory device according to claim 8, wherein:
said second selecting gate insulating film has a three-layered structure obtained by sandwiching a high dielectric constant layer between silicon oxide layers.

10. A semiconductor memory device according to claim 7, wherein:
a first selecting gate electrode is formed on a channel region of said selecting MOS transistor through a first selecting gate insulating film,
a second selecting gate electrode is formed on said first selecting gate electrode through a second selecting gate insulating film, and
said second selecting gate electrode is electrically connected to said first selecting gate electrode at a plurality of portions, so that an electrical resistance of said first selecting gate electrode is decreased by a parallel connection of said second selecting gate electrode.

11. A semiconductor memory device according to claim 10, wherein:
said second selecting gate insulating film has a three-layered structure obtained by sandwiching a high dielectric constant layer between silicon oxide layers.

* * * * *